United States Patent [19]

Sadamasa et al.

[11] 4,432,131
[45] Feb. 21, 1984

[54] METHOD FOR MANUFACTURING DISPLAY DEVICE

[75] Inventors: Tetsuo Sadamasa, Kawasaki; Osamu Ichikawa, Tokyo, both of Japan

[73] Assignee: Tokyo Shibaura Denki Kabushiki Kaisha, Kawasaki, Japan

[21] Appl. No.: 414,897

[22] Filed: Sep. 3, 1982

[30] Foreign Application Priority Data

Sep. 22, 1981 [JP] Japan ................................ 56-148835

[51] Int. Cl.³ ............................................. H01L 33/00
[52] U.S. Cl. .................................. 29/569 L; 29/588; 357/17
[58] Field of Search ............................ 29/569 L, 588; 174/52 PE; 264/272.11; 357/17

[56] References Cited

U.S. PATENT DOCUMENTS 3,149,765 9/1964 Horning ................................. 225/97
3,949,925 4/1976 Keizer ................................... 228/5.5

FOREIGN PATENT DOCUMENTS 57-45983 3/1982 Japan ................................. 29/569 L 1271128 4/1972 United Kingdom .

OTHER PUBLICATIONS

Usmani, A. M., et al., "New . . . Resins for Encapsulating Electronic Display Devices" in *J. Mater. Sci.,* 16(4), Apr. 1981, pp. 915-926.

*Primary Examiner*—Brian E. Hearn
*Assistant Examiner*—Alan E. Schiavelli
*Attorney, Agent, or Firm*—Oblon, Fisher, Spivak, McClelland & Maier

[57] ABSTRACT

In a method for manufacturing a display, a substrate having a surface on which a plurality of light-emitting diodes are aligned is disposed such that the surface opposes a surface of a table. A resin of a light-emitting and electrically insulating material which is kept in a fluid state is filled by capillarity into a space defined by the surface of the substrate and the surface of the table. The resin is then hardened, and the table is removed from a hardened resin. A display is obtained wherein at least the space between the adjacent LEDs is filled with the hardened resin.

18 Claims, 7 Drawing Figures

METHOD FOR MANUFACTURING DISPLAY DEVICE

BACKGROUND OF THE INVENTION

I. Field of the Invention

The present invention relates to a method for manufacturing a display device with a plurality of light-emitting diodes (LEDs) and, more particularly, to a method for manufacturing a display device by an improved resin molding method.

II. Description of the Prior Art

Generally, in a display device for displaying numbers and figures with a plurality of light-emitting diodes arrayed on an insulating substrate, the display device is provided with a light-transmitting insulating resin layer for improving the external luminous efficacy of the LEDs and for protecting the LEDs. The resin layer is formed by molding which is a significant technique in the manufacture of the display device.

As shown in FIG. 1, in conventional resin molding, a plurality of LEDs 2 are adhered by a silver paste to an insulating substrate 1 on which a wiring layer and terminals are formed. Wire bonding (not shown) is then performed. An adhesive tape 5 is adhered to the outer surface of the bottom of a synthetic resin case or frame 3 which has a wall and a through hole for housing each one of the LEDs 2. A predetermined amount of an insulating resin 4 is filled into the case 3. The surface of the insulating substrate 1 on which the LEDs 2 are formed faces downward and the insulating substrate 1 is inserted in the case 3. The insulating resin is thermally set to form an integral body of the case 3 and the insulating substrate 1. The adhesive tape 5 is peeled off from the bottom to prepare a display device.

However, according to the above conventional method for manufacturing a display device, the following problems are presented:

(1) Air bubbles tend to be trapped in the insulating resin 4. A defoaming process is required to eliminate the air bubbles. However, the air bubbles cannot easily be eliminated completely. Displayed objects become unclear due to the presence of air bubbles.

(2) The amount of insulating resin 4 to be filled into the case must be properly controlled, and accurate alignment of the case 3 with the insulating substrate 1 is required.

(3) The wall in the case 3 which is filled with the insulating resin 4 is necessary to manufacture the display device. However, if display devices of this type are assembled to form a large display device, the outermost LEDs of each display are spaced apart from each other due to the presence of the walls 3a. Thus continuity of the displayed figure cannot be achieved.

SUMMARY OF THE INVENTION

It is, therefore, an object of the present invention to provide a method for easily manufacturing a display device without forming air bubbles in the molded resin layer.

It is another object of the present invention to provide a method for maintaining continuity of a displayed figure at joining portions of a plurality of displays.

It is still another object of the present invention to provide a method for manufacturing a display device without using a case or frame.

According to the present invention, the surface of a substrate on which a plurality of light-emitting diodes are two-dimensionally aligned opposes a substantially horizontal surface of a table. A light-transmitting insulating resin in a fluid state is filled by capillarity into a space defined between the surface of the substrate and the surface of the table. Thereafter, the resin is hardened and the table is removed. Thus, a display device is obtained wherein at least a space between the adjacent LEDs is filled with the resin.

According to the method of the present invention, since the insulating resin is filled between the adjacent LEDs by capillarity, the frame need not be used. Further, since the capillarity phenomenon is utilized, the resin is gradually filled into the space between the adjacent LEDs, so that air bubbles may not be trapped in the insulating resin layer. Further, since the size of the insulating resin layer matches that of the insulating substrate, the pitch or distance between two adjacent LEDs becomes constant even when a plurality of displays are connected to form a large display device.

DETAILED DESCRIPTION OF THE PREFERRED EMBODIMENTS

Figure 1:
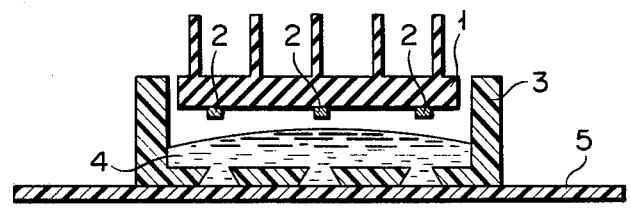
FIG. 1 is a sectional view for explaining the steps of manufacturing a conventional display device.

The present invention will be described in detail with reference to the accompanying drawings. The same reference numerals denote the same parts throughout the drawings.

Figure 2A:
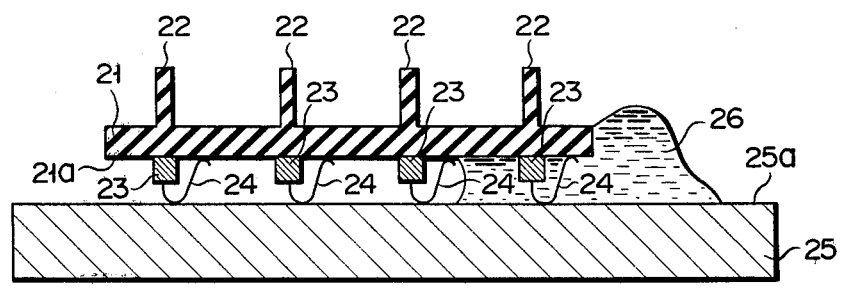
FIGS. 2A and 2B are sectional views for explaining the steps of manufacturing a display device according to an embodiment of the present invention.
Figure 2B:
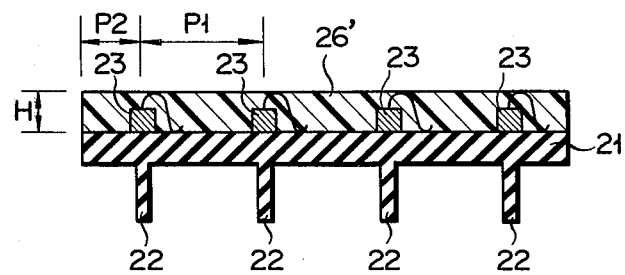

FIGS. 2A and 2B are sectional views for explaining the steps of manufacturing a display device according to a first embodiment of the present invention. Referring to FIG. 2A, a ceramic substrate 21 is prepared which has a plurality of legs 22 on its rear surface and a plurality of LEDs 23 which are two-dimensionally adhered to the front surface by an electrically conductive adhesive such as a silver paste. The LEDs 23 are adhered to the front surface of the ceramic substrate 21 through a metal wiring multi-layer (not shown). The LEDs 23 are bonded with the wiring multi-layer via gold wires 24, respectively. Only four LEDs are illustrated in FIG. 2A for descriptive convenience. Each LED is formed by growing gallium phosphide according to the liquid phase growth method and forming a p-n junction. When a foward bias voltage is applied across the p-n junction of the LED, the LED emits light. The LEDs 23 are selectively driven to display a character or a figure.

The ceramic substrate 21 is disposed so that its surface 21a opposes a horizontal surface 25a of a table 25. The area of the surface 25a of the table 25 is larger than that of the surface 21a of the substrate 21. The gold wires 24 bonded to the ceramic substrate 21 contact the surface 25a of the table 25 and support the ceramic substrate 21 on the table 25. Each one of the gold wires 24 bonded to the ceramic substrate 21 can be damaged by a tensile force of several tens of grams and is thus mechanically weak. Therefore, the face-down disposition as shown in FIG. 2A has never been performed in the conventional method. However, in a display device which has a number of LEDs on the ceramic substrate 21, that is, a number of gold wires, the gold wires 24 can support the ceramic substrate 21 as shown in FIG. 2A without trouble. Since the substrate 21 of ceramic, for example, has an area of 4 cm$^2$ and weighs about 2 g, a load imposed on each one of the gold wires 24 is less than 4 mg when pixels each of which comprises two LEDs which have different emitting colors are arranged in a 16×16 matrix, that is, 512 (2×16×16) LEDs are arranged. Even if the ceramic substrate 21 is placed face down on the table 25 as shown in FIG. 2A, the gold wires 24 may not be damaged.

An insulating resin 26 through which, when hardened, transmits light emitted from the LEDs 23 is placed on the surface 25a of the table 25 in a predetermined amount. The insulating resin 26 may be colored or colorless. The insulating resin 26, while in a fluid state, is allowed to contact one end of the ceramic substrate, so that the insulating resin 26 is drawn by capillarity into the small space formed between the surface 21a of the substrate and the surface 25a of the table 25. When a predetermined period of time has elapsed, the space is filled with the resin, and then the flow of the resin stops. According to the present invention, for the resin is filled into the space by capillarity in this manner, the viscosity of the insulating resin and/or the distance between the surface 21a of the ceramic substrate 21 and the surface 25a of the table 25 must be appropriately adjusted. These conditions can be set by a simple preliminary experiment. Since the size of the LED 23 is generally (0.2 mm to 0.5 mm)$^3$, the minimum distance between the surface 21a and the surface 25a is 0.2 mm to 0.5 mm (if the metal wires 24 are not bonded to the ceramic substrate 21, for example in the case where vapor-deposited wiring may be utilized). The maximum distance between the surface 21a and the surface 25a is generally about 1.0 mm, although the maximum distance may depend on the length of the wires extending from the LEDs. When the above conditions are determined, the viscosity of the insulating resin is easily determined. If the viscosity of the resin is low, the flow speed is high. The viscosity of the insulating resin 26 may be controlled by the temperature of the insulating resin 26. If heating is required for the insulating resin 26, the table 25 for supporting the insulating resin 26 is heated at a desired temperature. When an epoxy resin (e.g., Epoxy Resin 8005 commercially available from Nitto Electric Industrial Co., Ltd., Japan) is used, the table 25 is heated in a range from room temperature to 130° C. for optimal results. In the present invention, since the insulating resin 26 is filled in by capillarity, the surface 25a of the table 25 which supports the insulating resin 26 is substantially horizontal.

When the insulating resin 26 fills the small space between the surface 21a and the surface 25a, any excessive insulating resin is removed such that the periphery of the layer of the insulating resin 26 matches that of the ceramic substrate 21. The remaining resin is heated and hardened. The duration and temperature which are required for the heat treatment may vary in accordance with the type of the thermosetting resin used. For example, when Epoxy Resin 8005 is used, the resin is heated at a temperature of 100° C. for 2 hours and then at a temperature of 120° for 10 hours. The speed of the resin flow is not so slow as to harden the resin before it is completely filled into the space, even if it is heated.

After the insulating resin 26 is hardened, the table 25 is removed from the hardened resin 26' (FIG. 2B). The table 25 preferably has a smooth surface which may not adhere to the insulating resin 26 which fills the space, so that the table 25 can readily be removed from the hardened resin 26'. For example, the table as a whole may be made of a silicone resin. Alternatively, a releasing agent such as silicone oil may be coated on the table 25. Thus, a display device is obtained as shown in FIG. 2B.

A method for manufacturing a display device according to the present invention as described above has the following advantages as compared with the conventional method.

(1) Since the insulating resin is gradually filled by capillarity, air bubbles may not be left in the insulating resin. Thus, when the display device is driven, a clear image is obtained. Further, since the air bubbles may not be formed in the resin, the defoaming process need not be performed.

(2) Since the frame need not be used, the substrate need not be aligned with the frame, resulting in convenience.

(3) Since the insulating resin is filled only into the area corresponding to the size of the substrate 21, the layer of the hardened resin 26' has the same size as the substrate 21. Thus, a number of displays thus obtained can be connected to form a large display device. Referring to FIG. 2B, when a pitch $P_1$ between two adjacent LEDs is decreased, the density of the displayed image is increased to provide excellent readability. The pitch $P_1$ of the conventional display device can be generally minimized to about 0.8 mm at best according to currently adopted techniques. For guaranteeing the minimum pitch $P_1$ at a connection of display devices, a distance $P_2$ at the end portion of the display must be ½ $P_1$, that is, the distance $P_2$ must be less than 0.4 mm. The conventional method for manufacturing a display and the structure of a conventional display cannot satisfy the above requirement. However, when the method for manufacturing a display according to the present invention is adopted, the distance $P_2$ between the periphery of the display device and the outermost LED can be less than 0.4 mm. Thus, the display devices obtained according to the present invention can be connected with each other and still provide continuity of the displayed number and figure, as opposed to the conventional display.

(4) Since a height H of the layer of the hardened resin 26' can be reduced to a minimal extent required, irregular reflection at the end of the display device can be eliminated, providing excellent readability. If the hardened resin 26' is colored, the display pattern contrast is excellent under the condition where $H<P_1$.

Figure 3A:
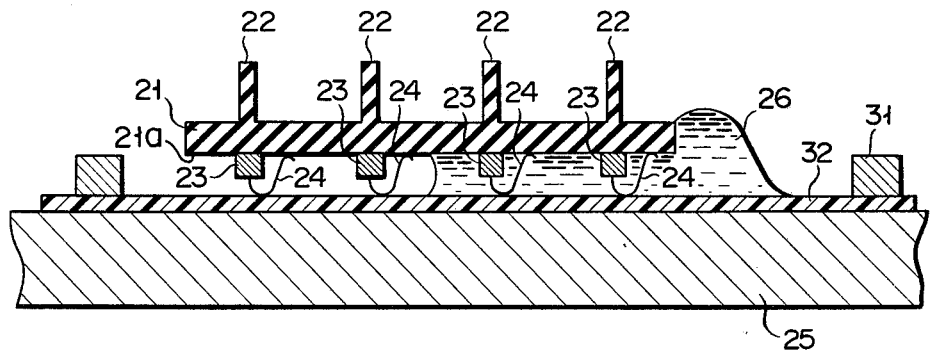
FIGS. 3A and 3B are sectional views for explaining the steps of manufacturing a display device according to another embodiment of the present invention.
Figure 3B:
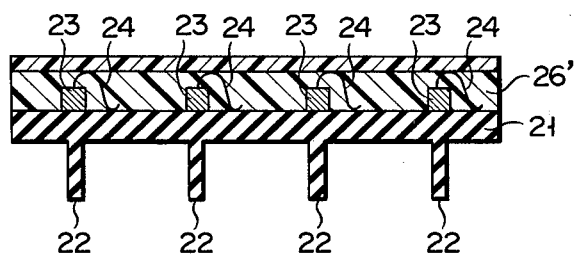

FIGS. 3A and 3B are sectional views for explaining the steps of manufacturing a display device according to a second embodiment of the present invention. According to this embodiment, a display device is provided which has a protective film which is detachable from the hardened resin layer. The second embodiment is substantially the same as the first embodiment described with reference to FIGS. 2A and 2B except that a tape 32 having an adhesive layer (not shown) on its one surface is adhered to a ring 31 which is made of a relatively heavy material such as a metal in order to apply uniform tension to the internal portion of the tape 32 within the ring 31, the adhesive layer together with the ring 31 is disposed on a table 25, a substrate 21 on which a plurality of LEDs 23 are arranged is disposed on an area of the tape 32 surrounded by the ring 31, and an insulating resin 26 is placed on the tape 32. In the same manner as described with reference to FIG. 2A, the insulating resin 26 is filled and hardened. The table 25 is then removed from the hardened resin 26', and the tape 32 is cut in accordance with the size of the substrate 21. Thus, a display device which has the tape 32 on the hardened resin layer 26' is obtained, as shown in FIG. 3B. The tape 32 need not be peeled off from the hardened resin 26' but may be a constituent of the display. Alternatively, the tape 32 may also be peeled off from the hardened resin 26'.

Various tests have been made to examine the adhesive tape materials. If the insulating resin is hardened by heat treatment, the best adhesive tape is one which is made of a heat resistant tape (e.g., polyester, Capton, and glass fiber) on which an adhesive (e.g., silicone- or resin-type adhesives) is coated. Especially when the silicone-type adhesive is used, the adhesive tape can be readily detachable from the layer of hardened insulating resin 26'. Further, after the insulating resin 26 is hardened, the excessive insulating resin can be readily removed. Unlike the first embodiment of the present invention, the table 25 need not have a smooth surface.

In the display device with the above structure, the following effects are obtained in addition to the advantages of the first embodiment.

(1) The tape can be colored to improve the contrast of the displayed character and figure.

(2) The tape functions as a very thin protective film.

(3) If a frost film which does not allow dispersion of light emitted from the LEDs is used, external light reflection can be prevented.

Figure 4A:
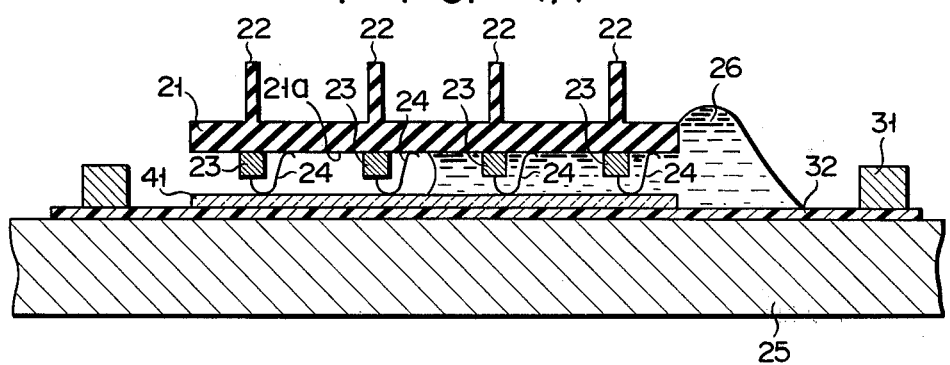
FIGS. 4A and 4B are sectional views for explaining the steps of manufacturing a display device according to still another embodiment of the present invention.
Figure 4B:
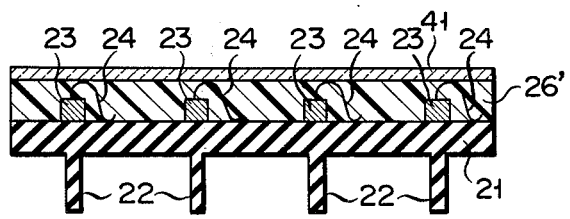

FIGS. 4A and 4B are sectional views for explaining the step of manufacturing a display device according to a third embodiment of the present invention. The third embodiment is substantially the same as the second embodiment except that a rigid plate 41 of a light transmitting and electric insulating material which has the same size as a surface 21a of a substrate 21 is intimately placed on an adhesive tape 32 with the adhesive layer directed upward, so as not to introduce an insulating resin 26 therebetween, after the adhesive tape 32 on which a ring 31 is adhered is placed on a table 25. The substrate 21 having LEDs 23 to which gold wires 24 are bonded is then aligned with the rigid plate 41 and disposed thereabove. In the same manner as in the first and second embodiments, the insulating resin 26 is filled into a space between the inner surface of the rigid plate 41 and the inner surface of the substrate 21. The insulating resin 26 is then hardened to form an integral body of the insulating resin 26 and the rigid plate 41. The table 25 is then removed, and the adhesive tape 32 is cut in accordance with the size of the substrate 21. The adhesive tape is peeled off from the rigid plate 41, and a display device as shown in FIG. 4B is prepared wherein the rigid plate 41 is formed on the layer of the hardened resin 26'. The rigid plate 41 may comprise glass, a synthetic resin such as an epoxy resin or polycarbonate.

In the display device having a structure as described above, a rigid protector is obtained which is stronger than that obtained in the second embodiment. A glass plate or a synthetic resin plate may be made of an excellent filter material. Since the synthetic resin plate is readily processed, a display device with a lens may be manufactured, thus providing excellent readability. Further, a guide such as a pole for alignment with the rigid plate 41 may be formed at the plate 41 in advance to simplify the manufacturing process.

The substrates 21 described with reference to the first to third embodiments have wire-bonded LEDs 23. However, the structure of the substrate 21 is not limited thereto. For example, other electrical conductors such as vapor-deposited wiring layer may be utilized in place of bonding wires. In this case, the substrate 21 is supported on the table 25 through the LEDs 23. That is, the LEDs 23 or its vapor-deposited wiring layer directly contacts the table 25, the tape 32 or the rigid plate 41.

What we claim is:

1. A method for manufacturing a display device, comprising the steps of:

disposing a substrate having a surface on which a plurality of light-emitting diodes are two-dimensionally aligned such that said surface of said substrate opposes a surface of a table which is substantially horizontal;

placing a resin of a light-transmitting and electrically insulating material which is kept in a fluid state on said table so as to bring said resin into contact with at least one side end of said substrate;

filling by capillarity said resin into a space between said surface of said table and said surface of said substrate while said resin is kept in the fluid state;

hardening said resin which is filled in said space; and removing said table from a hardened resin.

2. A method according to claim 1, wherein said space between said surface of said substrate and said surface of said table is not more than 1.0 mm.

3. A method according to claim 1, wherein said table is made of a material which does not adhere to said hardened resin.

4. A method according to claim 1, wherein said surface of said table is coated with a material which does not adhere to said hardened resin and is readily separated therefrom.

5. A method according to any one of claims 1 to 4, wherein said plurality of light-emitting diodes respectively have electrical conductors, and said substrate is supported on said table through said electrical conductor.

6. A method according to any one of claims 1 to 4, wherein said plurality of light-emitting diodes are in direct contact with said table.

7. A method according to claim 1, wherein said table directly supports a tape on said surface thereof, said tape opposing said surface of said substrate.

8. A method according to claim 7, wherein said tape has an adhesive layer on a surface thereof, said adhesive layer opposing said surface of said substrate.

9. A method according to claim 8, wherein said tape is made of a material which does not disperse light rays emitted from said diodes.

10. A method according to claim 8, wherein said tape is colored.

11. A method according to claim 7, wherein said tape is kept taut at a uniform tension by means of a ring.

12. A method according to any one of claims 7 to 11, wherein said plurality of light-emitting diodes respectively have electrical conductors, and said substrate is supported on said tape through said electrical conductors.

13. A method according to any one of claims 7 to 11, wherein said plurality of light-emitting diodes are in direct contact with said tape.

14. A method according to claim 1, wherein a tape which has an adhesive layer on a surface thereof is adhered on said surface of said table, and a plate of a light-transmitting and electrically insulating material is adhered on said adhesive layer of said tape and opposes said surface of said substrate.

15. A method according to claim 14, wherein said plate is made of glass or a synthetic resin.

16. A method according to claim 14, wherein said plate has a lens effect.

17. A method according to any one of claims 14 to 16, wherein said plurality of light-emitting diodes respectively have electrical conductors, and said substrate is supported on said plate through said electrical conductors.

18. A method according to any one of claims 14 to 16, wherein said plurality of light-emitting diodes are in direct contact with said plate.

* * * * *